US011932558B1

(12) United States Patent
Euler et al.

(10) Patent No.: US 11,932,558 B1
(45) Date of Patent: Mar. 19, 2024

(54) PIEZOCATALYSIS USING PIEZOELECTRIC POLYMERS

(71) Applicant: University of Rhode Island Board of Trustees, Kingston, RI (US)

(72) Inventors: William B. Euler, Narragansett, RI (US); Angela Thach, Lawrence, MA (US); Lasanthi Sumathirathne, Anuradhapura (LK); Benjamin B. Cromwell, Stoughton, MA (US); Mara Dubnicka, Plantsville, CT (US)

(73) Assignee: University of Rhode Island Board of Trustees, Kingston, RI (US)

( * ) Notice: Subject to any disclaimer, the term of this patent is extended or adjusted under 35 U.S.C. 154(b) by 439 days.

(21) Appl. No.: 17/190,248

(22) Filed: Mar. 2, 2021

Related U.S. Application Data (60) Provisional application No. 62/984,056, filed on Mar. 2, 2020.

(51) Int. Cl.
  *C02F 1/461* (2023.01)
  *C02F 1/467* (2023.01)
  (Continued)

(52) U.S. Cl.
  CPC ........ *C02F 1/46109* (2013.01); *C02F 1/4672* (2013.01); *C25B 1/04* (2013.01);
  (Continued)

(58) Field of Classification Search
  CPC ............... C02F 1/46109; C02F 1/4672; C02F 2001/46133; C02F 2101/345;
  (Continued)

(56) References Cited

U.S. PATENT DOCUMENTS

2002/0019308 A1 * 2/2002 Hitomi ..................... B01J 31/08
                                                          502/182

FOREIGN PATENT DOCUMENTS

CA       3045152 A1 * 12/2019 ......... H01L 41/0815
CN    104984668 A  * 10/2015
                (Continued)

OTHER PUBLICATIONS

Alhasani, M. , et al., "The Influence of ZN2+-doped PVDF on the Fluorescent Properties of Rhodamine 6G", J. Luminesc., vol. 196, 2018, 116-125.

(Continued)

*Primary Examiner* — Patricia L. Hailey
(74) *Attorney, Agent, or Firm* — Philip D. Askenazy; Peacock Law P.C.

(57) ABSTRACT

A piezoelectric polymer used as a piezocatalyst, and methods of manufacture and use therefor. A preferred piezoelectric polymer is poly(vinylidene difluoride) (PVDF) due to its piezoelectric response and good flexibility. The polymer can be doped with a metal, metal salt, metal carbonyl, metal oxide such as ZnO, $Co_2O_3$, or $TiO_2$, or ion such as $Cr^{3+}$, $Co^{2+}$, or $Zn^{2+}$. The dopant can be chosen so that when the polymer is PVDF the dopant increases the amount of β-phase PVDF and/or γ-phase PVDF relative to α-phase PVDF, thereby increasing the piezocatalytic response of the polymer. The compound to be decomposed can be adsorbed on the surface of the piezoelectric polymer. Applications include wastewater treatment, $CO_2$ capture and reduction, hydroformylation, water splitting, and ammonia synthesis.

21 Claims, 7 Drawing Sheets

(51) Int. Cl.
 C02F 101/34 (2006.01)
 C02F 101/38 (2006.01)
 C25B 1/04 (2021.01)
 C25B 1/27 (2021.01)
 C25B 3/07 (2021.01)
 C25B 3/26 (2021.01)
 C25B 11/095 (2021.01)
 H10N 30/857 (2023.01)

(52) U.S. Cl.
 CPC ............ C25B 1/27 (2021.01); C25B 3/07 (2021.01); C25B 3/26 (2021.01); C25B 11/095 (2021.01); H10N 30/857 (2023.02); C02F 2001/46133 (2013.01); C02F 2101/345 (2013.01); C02F 2101/38 (2013.01); C02F 2201/46115 (2013.01)

(58) Field of Classification Search
 CPC ....... C02F 2101/38; C02F 2201/46115; C25B 11/095; C25B 3/07; C25B 1/27; C25B 3/26; C25B 1/04; H10N 30/857
 USPC .......................................... 502/1, 150, 159
 See application file for complete search history.

(56) References Cited

FOREIGN PATENT DOCUMENTS

| | | | | |
|---|---|---|---|---|
| CN | 105642138 | B | * 6/2018 | ......... B01D 67/0013 |
| CN | 108251971 | A | * 7/2018 | ............... D01F 1/10 |
| CN | 109331882 | A | 2/2019 | |
| CN | 110090565 | A | * 8/2019 | ............. B01D 46/54 |
| CN | 113394335 | A | * 9/2021 | ............... G01L 1/16 |
| GB | 2469869 | A | * 11/2010 | ............. C30B 29/16 |
| JP | 2011165846 | A | * 8/2011 | ............. H01L 41/08 |
| JP | 2014011344 | A | * 1/2014 | ............. H01L 41/08 |
| KR | 20170062641 | A | * 6/2017 | ............ H01L 41/113 |
| KR | 20190107916 | A | * 9/2019 | ............ H01L 41/317 |

OTHER PUBLICATIONS

Austin, J. M., et al., "Electrochemical and Photoelectrochemical Properties of Rhodamine B", J. Phys. Chem., vol. 90, 1986, 1839-1843.
Benz, M., et al., "Determination of the Crystalline Phases of Poly(vinylidene fluoride) Under Different Preparation Conditions Using Differential Scanning Calorimetry and Infrared Spectroscopy", J. Appl. Polym. Sci., vol. 89, 2003, 1093-1100.
Benz, M., et al., "The Influence of Preparation Conditions on the Surface Morphology of Poly(vinylidene fluoride) Films", Langmuir, 2001, 239-243.
Benz, M., et al., "The Role of Solution Phase Water on the Deposition of Thin Films of Poly(vinylidene fluoride)", Macromolecules, vol. 35, 2002, 2682-2688.
Chen, X., et al., "High Relative Permittivity, Low Dielectric Loss and Good Thermal Stability of BaTiO3—Bi (Mg0.5Zr0.5)O3 Solid Solution", Ceram. Internat., vol. 41, 2015, 2081-2088.
Cui, Yongfei, et al., "Effect of Ferroelectricity on Solar-Light-Driven Photocatalytic Activity of BaTiO3-Influence on the Carrier Separation and Stern Layer Formation", Chem. Mater., 25, Oct. 17, 2013, 4215-4223.
Cui, Yongfei, et al., "Photodegradation of Rhodamine B Over Ag Modified Ferroelectric BaTiO3 Under Simulated Solar Light: Pathways and Mechanism", RSC Adv., 5, Mar. 24, 2015, 30372-30379.
Dai, Baoying, et al., "Greatly enhanced photocatalytic activity by organic flexible piezoelectric PVDF induced spatial electric field", Catal. Sci. Technol., 7, Oct. 2, 2017, 5594-5601.
Fontaine, K., et al., "Doping of PVDF with Cobalt Nitrate: Structural, Electrical, and Magnetic Properties", J. Polym. Sci. Part A: Polym. Chem., vol. 50, 2012, 3970-3975.

Franke, R., et al., "Applied Hydroformylation", Chem. Rev., vol. 11, 2012, 5675-5732.
Fu, J., et al., "Improving Dielectric Properties of PVDF Composites by Employing Surface Modified Strong Polarized BaTiO3 Particles Derived by Molten Salt Method", Appl. Mater. Interfaces, vol. 7, 2015, 24480-24491.
Fumoto, E., et al., "Characterization of an Iron-Oxide-Based Catalyst Used for Catalytic Cracking of Heavy Oil with Steam", Energy Fuels, vol. 32, 2018, 2834-2839.
Hong, Kuang-Sheng, et al., "Direct Water Splitting Through Vibrating Piezoelectric Microfibers in Water", Phys. Chem. Lett., 1, Mar. 2, 2010, 997-1002.
Hong, Deyi, et al., "High Piezo-photocatalytic Efficiency of CuS/ZnO Nanowires Using Both Solar and Mechanical Energy for Degrading Organic Dye", ACS Appl. Mater. Interfaces, 8, Aug. 5, 2016, 21302-21314.
Hong, Kuang-Sheng, et al., "Piezoelectrochemical Effect: A New Mechanism for Azo Dye Decolorization in Aqueous Solution Through Vibrating Piezoelectric Microfibers", J. Phys. Chem. C, 16, May 16, 2012, 13045-13051.
Indra Devi, P., et al., "Enhancement of Dielectric Constant in PVDF Polymer Using Dendrite-Shaped PbS Nanostructures", Optik, vol. 124, 2013, 3872-3875.
Jain, Anjana, et al., "Dielectric and Piezoelectric Properties of PVDF/PZT Composites: A Review", Polymer Engineering and Science, 2015, 1589-1616.
Jia, Yanmin, et al., "Giant Magnetoelectric Response from a Piezoelectric/Magnetostrictive Laminated Composite Combined with a Piezoelectric Transformer", Adv. Mater., 20, Oct. 20, 2008, 4776-4779.
Katsouras, I., et al., "The Negative Piezoelectric Effect of the Ferroelectric Polymer Poly(vinylidene fluoride)", Nat. Mater., vol. 15, 2016, 78-84.
Kawai, H., "The Piezoelectricity of Poly(vinylidene fluoride)", Japan. J. Appl. Phys., vol. 8, 1969, 975-976.
Khan, M. A, et al., "Ferroelectric Polarization Effect on Surface Chemistry and Photo-Catalytic Activity: A review", Surf. Sci. Rep., 71, Jan. 25, 2016, 1-31.
Li, Haidong, et al., "Enhanced Ferroelectric-Nanocrystal-Based Hybrid Photocatalysis by Ultrasonic-Wave-Generated Piezophototronic Effect", Nano Lett., 15, Mar. 24, 2015, 2372-2379.
Liang, Zhang, et al., "Piezoelectric materials for catalytic/photocatalytic removal of pollutants: Recent advances and outlook", Applied Catalysis B: Environmental 241 (2019), Sep. 15, 2018, 256-269.
Lin, He, et al., "Piezoelectrically Induced Mechano-Catalytic Effect for Degradation of Dye Wastewater through Vibrating Pb(Zr0.52Ti0.48)O3 Fibers", Appl. Phys. Lett., 104, Apr. 24, 2014, 162907.
Lin, Hung-Ming, et al., "Synergistic piezophotocatalytic and photoelectrochemical performance of poly(vinylidene fluoride)-ZnSnO3 and poly(methyl methacrylate)-ZnSnO3 nanocomposites", RSC Adv., 7, Jun. 14, 2017, 30513-30520.
Liu, Y., et al., "Low Overpotential Water Oxidation at Neutral pH Catalyzed by a Copper Porphyrin", Chem. Sci., vol. 10, 2019, 2613-2622.
Lo, Ming-Kai, et al., "Study of ZnSnO3-Nanowire Piezophotocatalyst Using Two-Step Hydrothermal Synthesis", J. Phys. Chem. C, 119, Feb. 15, 2015, 5218-5224.
Lovinger, A. J., et al., "Chain Tilt in α-Poly(vinylidene fluoride)", Macromolecules, vol. 29, 1996, 8541-8542.
Lovinger, A. J., et al., "Compositional Variation of the Structure and Solid-State Transformations of Vinylidine Fluoride/Tetrafluoroethylene Copolymers", Macromolecules, vol. 21, 1988, 78-83.
Lovinger, A. J., "Ferroelectric Polymers", Science, vol. 220, 1983, 1115-1121.
Lovinger, A. J., et al., "On the Curie Temperature of Poly(vinylidene fluoride)", Macromolecules, vol. 19, 1986, 1491-1493.
Lovinger, A. J., et al., "The Role of Molecular Defects on the Structure and Phase Transitions of Poly(vinylidene fluoride)", Polymer, 1987, 617-626.
Lv, Wei, et al., "Enhancement Effect in the Piezoelectric Degradation of Organic Pollutants by Piezo-Fenton Process" J. Chem. Technol. Biotechnol., 2017, 92, Mar. 16, 2016, 152-156.

(56) References Cited

OTHER PUBLICATIONS

Marino, Andrew A, et al., "Piezoelectric Effect and Growth Control in Bone", Nature, vol. 228, Oct. 31, 1970, 473-474.
McHedlov-Petrosyan, N. O., et al., "Aggregation of Rhodamine B in Water", Russ. J. Appl. Chem., vol. 77, 2004, 414-422.
Mullen, M. , et al., "The Influence of Interfacial Effects on the Photophysics of Rhodamine 6G Thin Films on a Poly (vinylidene fluoride) Surface", Langmuir, vol. 33, 2017, 2194-2204.
Novoa-Ortega, E. , et al., "Structure-Property Relationships on the Optical Properties of Rhodamine Thin Films", J. Phys. Chem. C, vol. 124, 2020, 16058-16068.
Oldham, K. B., "The Potential-Dependence of Electrochemical Rate Constants", J. Electroanal. Chem. Interfacial Electrochem., vol. 16, 1968, 125-130.
Osaki, Shigeyoshi , et al., "Effects of Annealing and Isothermal Crystallization Upon Crystalline Forms of Poly (vinylidene fluoride)", Polym. Sci., Polym. Phys. Ed., 13, 1975, 1071-1083.
Prest, W. M, et al., "The Formation of the $\gamma$ Phase from the $\alpha$ and $\beta$ Polymorphs of Polyvinylidene Fluoride", Appl. Phys., 49, 1978, 5042-5047.
Prest, W. M, et al., "The Morphology and Thermal Response of High-Temperature-Crystallized Poly(vinylidene fluoride)", Appl. Phys., 46, 1975, 4136-4143.
Qian, Weiqi , et al., "Piezoelectric Material-Polymer Composite Porous Foam for Efficient Dye Degradation via the Piezo-Catalytic Effect", ACS Appl. Mater. Interfaces, 11, 2019, 27862-27869.
Schaider, L. A., et al., "Review of Organic Wastewater Compound Concentrations and Removal in Onsite Wastewater Treatment Systems", Environ. Sci. Technol., vol. 51, 2017, 7304-7317.
Singh, D. , et al., "Flexible and Robust Piezoelectric Polymer Nanocomposites Based Energy Harvesters", ACS Appl. Mater. Interfaces, vol. 10, 2018, 2793-2800.
Starr, Matthew B, et al., "Coupling of Piezoelectric Effect with Electrochemical Processes", Nano Energy, 14, Jan. 30, 2015, 296-311.
Starr, Matthew B, et al., "Fundamental Analysis of Piezocatalysis Process on the Surfaces of Strained Piezoelectric Materials", Scientific Reports, 3:2160, Jul. 8, 2013, 1-8.
Starr, Matthew B, et al., "Piezopotential Driven Redox Reactions at the Surface of Piezoelectric Materials", Angew. Chem. Int. Ed., 51, May 3, 2012, 5962-5966.
Stock, Matthew , et al., "Influence of the Ferroelectric Nature of Lithium Niobate to Drive Photocatalytic Dye Decolorization under Artificial Solar Light", J. Phys. Chem. C, 116, Sep. 5, 2012, 20854-20859.
Sun, Cong , et al., "Ultrafast Piezo-Photocatalytic Degradation of Organic Pollutions by Ag2O/Tetrapod-ZnO Nanostructures Under Ultrasonic/UV Exposure", RSC Adv., 6, Sep. 8, 2016, 87446-87453.
Moreno-Villoslada, I. , et al., "pH Dependence of the Interaction between Rhodamine B and the Water-Soluble Poly(sodium 4-styrenesuldonate)", J. Phys. Chem. B, vol. 110, 2006, 11809-11812.
Surmenev, Roman A, et al., "Hybrid lead-free polymer-based nanocomposites with improved piezoelectric response for biomedical energy-harvesting applications: A review", Nano Energy 62, Apr. 30, 2019, 475-506.
Tan, Chuan Fu, et al., "Self-Biased Hybrid Piezoelectric-Photoelectrochemical Cell with Photocatalytic Functionalities", ACS Nano, 9, Jun. 29, 2015, 7661-7670.
Tashiro, Kohji , et al., "Vibrational Spectra and Disorder-Order Transition of Poly(vinylidene fluoride) Form II", Macromolecules, 14, 1981, 1757-1764.
Tiwari, Divya , et al., "Photochemical Reduction of Al3+ to Al0 Over a Ferroelectric Photocatalyst-LiNbO3", Mater. Lett., 79, Mar. 31, 2012, 18-20.
Vedrine, J. C., "Metal Oxides in Heterogeneous Oxidation Catalysis: State of the Art and Challenges for a More Sustainable World", ChemSusChem, vol. 12, 2019, 577-588.
Vinogradov, A. , et al., "Electro-Mechanical Properties of the Piezoelectric Polymer PVDF", Ferroelectrics, vol. 226, 1999, 169-181.
Viola, E. A., et al., "Computational Analysis of Bending Strain in Single Chains of $\beta$-PVDF", J. Polym. Sci. Part B: Polym. Phys., vol. 49, 2011, 1493-1495.
Walcott, S. , "The Load Dependence of Rate Constants", J. Chem. Phys., vol. 128, 2008, 215101.
Wang, Xudong , et al., "Piezoelectric Nanogenerators—Harvesting Ambient Mechanical Energy at the Nanometer Scale", Nano Energy, 2012, 1, Oct. 4, 2011, 13-24.
Wang, Zhong Lin, "Piezopotential Gated Nanowire Devices: Piezotronics and Piezo-phototronics", Nano Today, 5, Oct. 28, 2010, 540-552.
Wang, Ya-Ting , et al., "Piezopotential-Induced Schottky Behavior of Zn1—xSnO3 Nanowire Arrays and Piezophotocatalytic Applications", J. Am. Ceram. Soc., 99, 2016, 2593-2600.
Wu, Jyh Ming, et al., "Piezo-Catalytic Effect on the Enhancement of the Ultra-High Degradation Activity in the Dark by Single- and Few-Layers MoS2 Nanoflowers", Adv. Mater., 28, Mar. 8, 2016, 3718-3725.
Xue, Xinyu , et al., "Piezo-Potential Enhanced Photocatalytic Degradation of Organic Dye Using ZnO Nanowires", Nano Energy, 13, Feb. 25, 2015, 414-422.
Yang, Weiguang , et al., "Ferroelectric Polarization-Enhanced Photoelectrochemical Water Splitting in TiO2—BaTiO3 Core-Shell Nanowire Photoanodes", Nano Lett., 15, Oct. 22, 2015, 7574-7580.
You, Huilin , et al., "Harvesting the Vibration Energy of BiFeO3 Nanosheets for Hydrogen Evolution", Angew. Chem. Int. Ed., 58, 2019, 11779-11784.
Zhang, Yan , et al., "Control of Electro-Chemical Processes Using Energy Harvesting Materials and Devices", Chem Soc. Rev., 46, Nov. 10, 2017, 7757-7786.
Zhang, Jun , et al., "Piezoelectric Bimorph Cantilever for Vibration-Producing-Hydrogen", Sensors, 2013, 13, Dec. 27, 2012, 367-374.
Zhang, Jin , et al., "Piezoelectric Effects and Electromechanical Theories at the Nanoscale", Nanoscale, 6, Sep. 19, 2014, 13314-13327.
Zhang, H. , et al., "Simultaneously Harvesting Thermal and Mechanical Energies based on Flexible Hybrid Nanogenerator for Self-Powered Cathodic Protection", ACS Appl. Mater. Interfaces, vol. 7, 2015, 28142-28147.
Zhong, H. , et al., "Ni and Zn/ZnO Synergistically Catalyzed Reduction of Bicarbonate into Formate with Water Splitting", ACS Appl. Mater. Interfaces, vol. 11, 2019, 42149-42155.

\* cited by examiner

α-phase
PRIOR ART
FIG. 1A

β-phase
PRIOR ART
FIG. 1B

γ-phase
PRIOR ART
FIG. 1C

PRIOR ART

FIG. 2

*PRIOR ART*

FIG. 3

*PRIOR ART*

PIEZOCATALYSIS USING PIEZOELECTRIC POLYMERS

CROSS-REFERENCE TO RELATED APPLICATIONS

This application claims priority to and the benefit of the filing of U.S. Provisional Patent Application No. 62/984,056, entitled "Piezocatalysis Using Piezoelectric Polymers", filed on Mar. 2, 2020, the entirety of which is incorporated herein by reference.

BACKGROUND OF THE INVENTION

Field of the Invention (Technical Field)

The present invention is related to piezocatalysis using piezoelectric polymers or polymers that have a piezoelectric phase, such as poly(vinylidene difluoride) (PVDF), metal-ion doped PVDF, and co-polymers of 1,1-difluoroethylene and trifluoroethylene. The piezoelectric effect can be produced using ultrasound, which requires substantially reduced energy than thermal methods. In addition to the piezoelectric effect, flexible polymer films can be doped or coated with known chemical catalysts, such as oxides or metals, to improve catalytic activity.

Background Art

Note that the following discussion may refer to a number of publications and references. Discussion of such publications herein is given for more complete background of the scientific principles and is not to be construed as an admission that such publications are prior art for patentability determination purposes.

In order to improve sustainability new or modified catalysts are needed that improve or maintain activity and selectivity but can be more energy efficient. The piezoelectric effect can be used to transduce mechanical motion into electrical charge that then is used to catalyze electron transfer reactions. This process, known as piezocatalysis, is relatively understudied and has been exclusively used with ceramic-based piezoelectric materials. More recently, these studies have been extended to include light as part of the catalytic system, using a piezophotocatalyst.

An ideal heterogeneous catalyst has a marked increase in reaction rate and a high turn-over number, works at ambient temperature, is effective at atmospheric pressure (for gas-phase reactions), produces one specific product, and is not poisoned by the reaction conditions. No catalyst meets all of these requirements. Heterogeneous catalysts compose 80% of all industrial catalytic processes. Metal oxide catalysts are used in a variety of oxidation processes including petrochemical refinement, pharmaceuticals, and wastewater treatment. Typical support materials for metal oxide catalysts include silica, alumina, zeolites, or carbon because these materials are stable to the high temperatures required for many industrial processes. If the temperatures required for productive catalysis could be reduced, then there would be both energy savings from the reduced thermal need and the opportunity to use other types of supports that may assist in some aspect of the chemical reaction of interest. Some examples include iron or cobalt oxides used in Fischer-Tropsch processes, Cu/ZnO used in hydroformylation, iron oxide used to crack heavy petroleum, and chromium oxides used in alkene polymerizations.

Figure 1A:
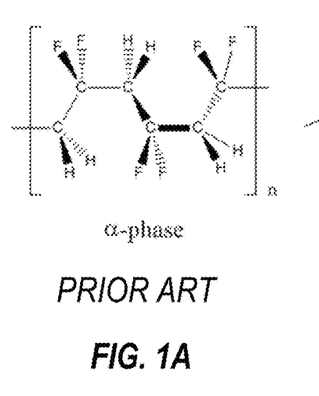
FIG. 1A shows the structure of the α-phase of PVDF.
Figure 1B:
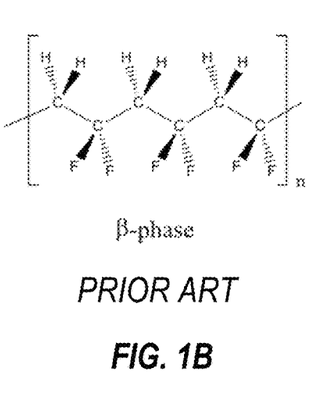
FIG. 1B shows the structure of the β-phase of PVDF.
Figure 1C:
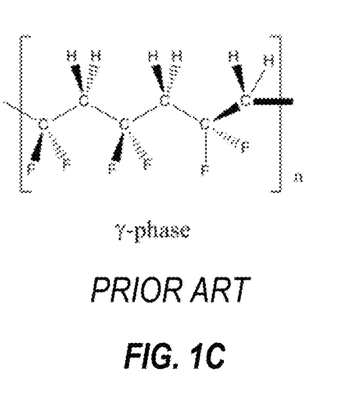
FIG. 1C shows the structure of the γ-phase of PVDF.

PVDF, $(CH_2CF_2)_x$, is found primarily in three crystalline phases: the $\alpha$-phase, which is nonpolar; the $\beta$-phase which is ferroelectric; and the $\gamma$-phase, which is polar. Both the $\beta$- and $\gamma$-phases are piezoelectric. The phases are differentiated by the stereochemistry of the $\alpha$-bonds along the polymer chain. The $\alpha$-phase alternates s-trans and s-gauche orientations (typically written as TGTG', where the prime indicates a dihedral angle of opposite sign relative to an unprimed letter). The $\beta$-phase has all s-trans bonds while the $\gamma$-phase has a TTTGTTG' sequence of sigma bonds. FIGS. 1A-1C show the structures of the $\alpha$-phase, $\beta$-phase, and $\gamma$-phase of PVDF respectively.

Most methods for preparing PVDF result in a composition that is primarily the nonpolar $\alpha$-phase. The most common method for obtaining the $\beta$-phase is electrically poling a stretched film at temperatures under the melting point. Deposition from sufficiently polar solvents can increase the proportion of $\beta$-phase, but this technique generally leads to a large fraction of $\gamma$-phase as well. $\beta$-phase PVDF can also be obtained synthetically by co-polymerizing 1,2-difluoroethylene with 1,1,2-trifluoroethylene or tetrafluoroethylene. Addition of hydrated metal salts to solutions of PVDF lead to deposition of films with a high $\beta$-phase content. When the doping ion is $Co^{2+}$, the metal ion weakly bonds to the fluorine atoms along the polymer backbone. This leads to a cooperative effect of aligning all of the bond dipole moments along the polymer chain, which accounts for the $\beta$-phase crystallization. Doping PVDF with other metal ions, including $Zn^{2+}$, also induces $\beta$-phase formation. $Co^{2+}$-doped PVDF is a relaxor ferroelectric, which is a material with smaller domains (on the order of 10-100 nm) than normal ferroelectrics (domain sizes of $\mu m$ or larger). Relaxor ferroelectrics also are electrostrictive, i.e., have large piezoelectric characteristics, which is ideal for piezocatalysis.

Figure 2:
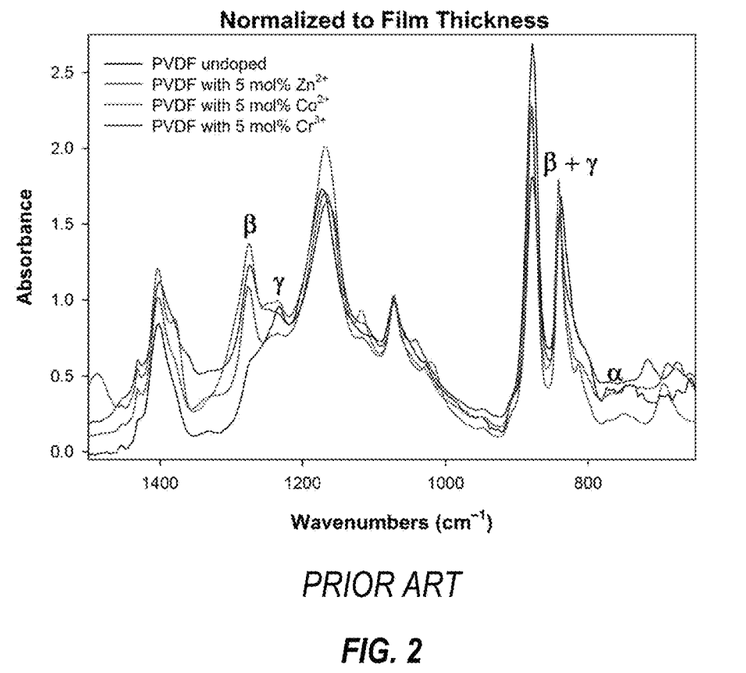
FIG. 2 shows IR spectra of thin films of undoped PVDF (black line), 5 mol % $Zn^{2+}$ doped PVDF (green line), 5 mol % $Co^{2+}$ doped PVDF (red line), and 5 mol % $Cr^{3+}$ doped PVDF. The phase marker peaks are labeled. All spectra are normalized to film thickness using the peak at 1070 $cm^{-1}$.

IR spectra have been used to determine the phase composition in PVDF thin films. The $\alpha$-phase is indicated by a strong absorption at 762 $cm^{-1}$, the $\beta$-phase is indicated by a feature at 1275 $cm^{-1}$, and the $\gamma$-phase marker is at 1235 $cm^{-1}$. In addition, a peak at 840 $cm^{-1}$ represents a mixture of $\beta$- and $\gamma$-phases. As shown in FIG. 2, undoped PVDF shows strong phase marker peaks at 1235 and 840 $cm^{-1}$, indicative of a significant fraction of $\gamma$-phase, and only a small absorption at 762 $cm^{-1}$, showing the lack of $\alpha$-phase. All of the metal doped PVDF thin films show strong absorption at 1275 $cm^{-1}$, demonstrating a significant increase in the $\beta$-phase, and a weaker peak at 1235 $cm^{-1}$, showing a loss of the $\gamma$-phase. The peak near 840 $cm^{-1}$ has little intensity change, suggesting that the metal ion doping induced conversion of $\gamma$-phase to $\beta$-phase.

Figure 3:
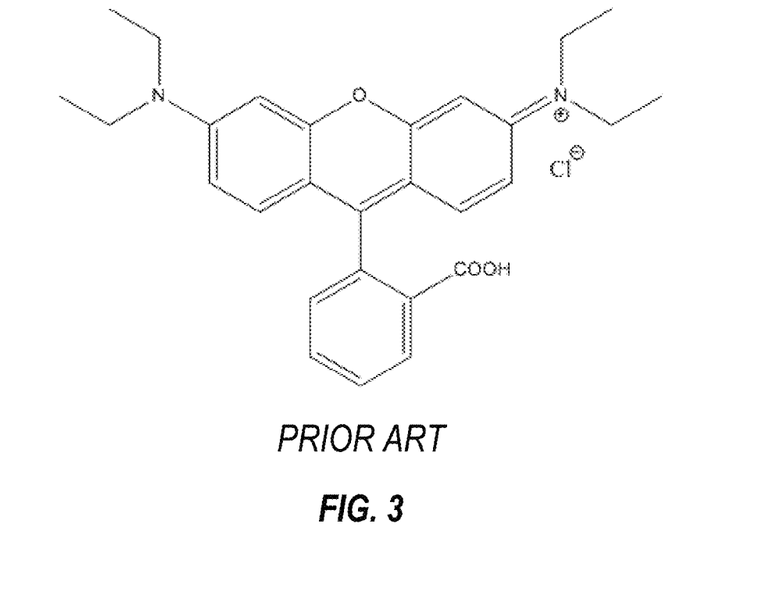
FIG. 3 shows the structure of Rhodamine B.

Piezocatalysis has been used for the decomposition of an aqueous solution of rhodamine B (RhB), whose structure is shown in FIG. 3, using $BaTiO_3$ deposited into a poly(dimethylsiloxane) (PDMS) foam. A 400 W ultrasonic horn was used to irradiate the solution, and the absorption spectrum as a function of irradiation time was monitored. It was reported that 94% of the RhB was decomposed in two hours.

SUMMARY OF THE INVENTION (DISCLOSURE OF THE INVENTION)

An embodiment of the present invention is a piezocatalyst comprising a piezoelectric polymer, which preferably comprises poly(vinylidene difluoride) (PVDF). The piezoelectric polymer optionally comprises a copolymer of PVDF and poly(trifluoroethylene), a co-polymer of 1,1-difluoroethylene and trifluoroethylene, a copolymer of 1,2-difluoroethylene and 1,1,2-trifluoroethylene, or a copolymer of 1,2- difluoroethylene ngtetrafluoroethylene. The piezoelectric polymer preferably comprises a dopant, which is preferably a metal. The metal optionally comprises Cu, Zn, Co, Rh, or Cr and is optionally derived from a metal nitrate hydrate. The piezoelectric polymer optionally comprises 5 mole % of the metal dopant. The metal dopant is preferably an ion such as $Cr^{3+}$, $Co^{2+}$, or $Zn^{2+}$. When the UW-piezoelectric polymer comprises PVDF the metal dopant preferably increases the amount of β-phase PVDF and/or γ-phase PVDF relative to α-phase PVDF. The dopant is optionally a metal salt, a metal carbonyl, or a metal oxide such as ZnO, $Co_2O_3$, or $TiO_2$. The piezoelectric polymer preferably comprises a film having a thickness greater than or equal to about 250 nm, more preferably greater than or equal to about 500 nm, and even more preferably greater than or equal to about 750 nm. The piezoelectric polymer preferably comprises the compound to be decomposed, the compound adsorbed on the surface of the piezoelectric polymer.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate the practice of embodiments of the present invention and, together with the description, serve to explain the principles of the invention. The drawings are only for the purpose of illustrating certain embodiments of the invention and are not to be construed as limiting the invention. In the drawings.

DETAILED DESCRIPTION OF EMBODIMENTS OF THE INVENTION

Piezocatalysis is an electrochemical process where a surface potential is created by the piezoelectric transduction of mechanical motion, which can then be used in further processes. For a one-dimensional material of width l, the piezoelectric polarization induces an electric field across the membrane given by $$V = \frac{lTd}{\varepsilon_o \varepsilon_r} \quad [1]$$

where T is the stress placed across the membrane, d is the piezoelectric tensor component, $\varepsilon_0$ is the permittivity in a vacuum, and $\varepsilon_r$ is the relative permittivity of the membrane. From Equation [1], the key materials property for generating a piezoelectric voltage is the ratio of d/$\varepsilon_r$. In traditional ceramic piezoelectrics, such as $BaTiO_3$, d is approximately 190 pC/N and $\varepsilon_r$ is approximately 8900, making dV& approximately 190/8900=0.021 pC/N. For poly(vinylidene difluoride) (PVDF), a well-known, relatively inexpensive piezoelectric polymer, the piezoelectric coupling is approximately 10 pC/N, which is almost 20× less than that of the ceramic. This is why polymers have not to date been used, or even considered as good candidates, for piezocatalysis. However, for PVDF $\varepsilon_r$ is approximately 10, so d/$\varepsilon_r$ is approximately 10/10=1 pC/N. This unexpected result suggests that PVDF will be significantly more effective than barium titanate in generating a voltage that can be used for catalysis. Furthermore, since PVDF is a soft material and can be cast into thin membranes, it is potentially more deformable than a ceramic. Consider a typical thin film of PVDF that is 1 μm thick. A deformation of 1% (i.e., a strain of s=0.01, easily attained for a polymer) gives a stress of $T=Ys=(2.7\times10^9 N/m^2)(0.01)=2.7\times10^7 N/m^2$, where $Y=2.7\times10^9 N/m^2$ is the Young's modulus for PVDF. Then, the piezoelectric voltage generated is estimated to be, approximately, $V=(1\times10^{-6} m)(2.7\times10^7 N/m^2)(10\times10^{-12} C/N)/(8.85\times10^{-12} C^2J^{-1}m^{-1})(10)=3$ V. This is sufficient voltage to affect most electron transfer reactions and is comparable to the voltages measured for MgO doped P(VDF-TrFe) copolymer.

Polymers such as PVDF can be cast into flexible membranes, which can then be used in a number of environments in which ceramic components might be unusable. PVDF-based piezocatalysts can be activated by ultrasound or other sources of mechanical motion. Heterogeneous catalysts can be added to the base system for specific reactions or specific products. In embodiments of the present invention, as detailed in the Examples below, PVDF and related polymers are used to decompose rhodamine B (RhB) with various dopants, preferably using a common ultrasonic cleaner as the source of the mechanical motion. The rate constants for the decomposition can depend on the fraction of piezoelectric phase in the polymer thin film and with the thickness of the film. The piezoelectric field at the surface of the polymer film may induce hemolytic scission of a C—N bond in the RhB, which then reacts with water to form products. Because PVDF exhibits chemical resistance, having stability with respect to acids, nonpolar solvents, and oxidation/reduction, it is expected that PVDF substrates will be good supports for catalysts.

Zinc oxide is a known catalyst for the reduction of organic compounds. Thus, in one embodiment of the present invention, ZnO is added to PVDF. This can be done either as a dopant in the bulk of the polymer or as a thin (e.g. a few 100 nm or less) layer on the surface of the metal-doped PVDF. In other embodiments, other piezoelectric polymers may be used, for example the co-polymer of PVDF and poly(trifluoroethylene): $(CH_2CF_2)_x$—$(CHFCF_2)_y$. The ground state of this co-polymer is piezoelectric but it is extremely expensive. In some embodiments the optional addition of photocatalysts means that coupling light with the mechanical energy source will result in a further reduction of fossil fuel energy sources.

Other Applications

Applications for the present invention include any electron transfer reaction, fibers in clothing so that the garment becomes self-cleaning or self-decontaminating by the motion of the wearer, VOC treatment using wind, petroleum cracking, polymerizations, wound decontamination, and reduction of energy requirements for $N_2$ fixation. Other applications, described in more detail, are as follows.

Wastewater Treatment

The presence of over-the-counter drugs in wastewater has been a growing problem. Inexpensive piezocatalysts based on PVDF in accordance with the present invention can be added to waste streams. The motion of the waste stream can activate the catalyst to slowly decompose the organic molecules over time. PVDF doped with simple metal ions will be cost effective and, as demonstrated for RhB, can decompose organic molecules.

About 20% of homes in the United States use septic systems. Internationally, this is likely an even higher number, especially in developing countries. Onsite wastewater treatment to remove pharmaceuticals, detergents, or other organic toxins is rarely performed. Yet these contaminants have the potential to lead to significant health problems or have adverse environmental impact.

Using PVDF membranes with appropriate catalysts to decompose the organic materials would be a cost-effective method to reduce the concentration of contaminants. Piezocatalysis requires mechanical deformation of the membrane to generate the piezoelectric potential, which could be accomplished by placing the active membrane in the water flow. Owing to the high piezoelectric coefficient of β-phase PVDF, the motion of the fluid across the membrane would be sufficient to develop a potential of about 1-1.5 V, which would be sufficient to decompose most household organic wastes.

Table 1 shows the structures and some of the relevant properties of some common over-the-counter drugs found in wastewater streams. This set of target molecules span a variety of potentials, from about 0.7 V to about 1.8 V (vs Ag/AgCl), which will help assess the range of the piezocatalysis. The concentration ranges for these molecules in water covers several orders of magnitude, from about $10^{-9}$ M to about $10^{-5}$ M. The chemical structures of the target materials vary considerably as well. Ibuprofen and salicylic acid have carboxylic acid groups that are possible reduction sites. The tertiary amine is the site most susceptible to electron transfer in diphenhydramine.

TABLE 1

Target Compounds

| Compound | Structure | Waste stream concentration (μg/L, M) | E° (V vs. Ag/AgCl) |
|---|---|---|---|
| Acetaminophen $C_8H_9NO_2$ | | 1400, $9 \times 10^{-6}$ | 0.725 |
| Caffeine $C_8H_{10}N_4O_2$ | | 9380, $5 \times 10^{-5}$ | 1.3 |
| Cotinine $C_{10}H_{12}N_2O$ | | 51, $3 \times 10^{-7}$ | 1.77 |

TABLE 1-continued

Target Compounds

| Compound | Structure | Waste stream concentration (μg/L, M) | E° (V vs. Ag/AgCl) |
|---|---|---|---|
| Diphenhydramine $C_{17}H_{21}NO$ |  | 0.7, $3 \times 10^{-9}$ | 1.045 |
| Ibuprofen $C_{13}H_{18}O_2$ |  | 135, $7 \times 10^{-7}$ | 1.65 |
| Salicylic acid $C_7H_6O_3$ |  | 282, $2 \times 10^{-6}$ | 1.1 |

$CO_2$ Capture and Reduction

The reduction of $CO_2$ at low cost is an extremely important goal. There is nearly universal concern about climate change. Although there are a number of possible contributors to this environmental problem, rising levels in the atmosphere of carbon dioxide, a greenhouse gas, is certainly an important source. Thus, removing $CO_2$ from the atmosphere is an important objective. Ideally, this capture would reduce the carbon dioxide to a useful product that could be used productively. Ideally, these reductions would be to useful chemical feedstocks. Table 2 shows that the reduction of $CO_2$ can be slightly thermodynamically favorable. Other known catalysts for $CO_2$ reduction that can be incorporated into the PVDF membranes include $Co_2O_3$, $TiO_2$, and Cu. Whether or not piezocatalysis can lead to selective product formation is unknown. However, it may be possible to tune the product distribution based on the ultrasonication power. Since the piezoelectric potential depends on the film thickness and the applied strain, it may be that the reactivity can be controlled.

TABLE 2

Standard reduction potentials for $CO_2$

| Reaction | E° vs NHE (V) |
|---|---|
| $CO_2(g) + 4\ H^+(aq) + 4\ e^- \rightarrow C(s) + 2\ H_2O(l)$ | +0.210 |
| $CO_2(g) + 6\ H^+(aq) + 6\ e^- \rightarrow CH_3OH(l) + H_2O(l)$ | +0.016 |
| $CO_2(g) + 8\ H^+(aq) + 8\ e^- \rightarrow CH_4(g) + 2\ H_2O(l)$ | +0.169 |
| $2\ CO_2(g) + 12\ H^+(aq) + 12\ e^- \rightarrow CH_2CH_2(g) + 4\ H_2O(l)$ | +0.064 |
| $2\ CO_2(g) + 12\ H^+(aq) + 12\ e^- \rightarrow CH_3CH_2OH(l) + 3\ H_2O(l)$ | +0.084 |

Ni/Zn/ZnO has been used with aqueous bicarbonate ions to generate formate ions:

$$CO_2(g) + H_2O(l) \rightleftharpoons HCO_3^-(aq) + H^+(aq)$$

$$HCO_3^-(aq) + Zn \xrightarrow{Ni/ZnO} HCO_2^-(aq) + ZnO(s)$$

The formate product is easily converted to other chemical feedstocks. The reductant in this reaction, Zn, is inexpensive and, conveniently, the oxidized product (ZnO) can be recycled as the catalyst. The reaction is optimized at about 200° C., so is energetically expensive. Incorporating the Ni/ZnO catalyst into the PVDF, followed by coating the surface of the polymer with islands of Zn, would give a catalyst system that could be used to reduce $CO_2$. Known catalysts for $CO_2$ reduction that can be easily incorporated into the PVDF membranes include ZnO, $Co_2O_3$, $TiO_2$, and Cu.

Hydroformylation

Figure 4:
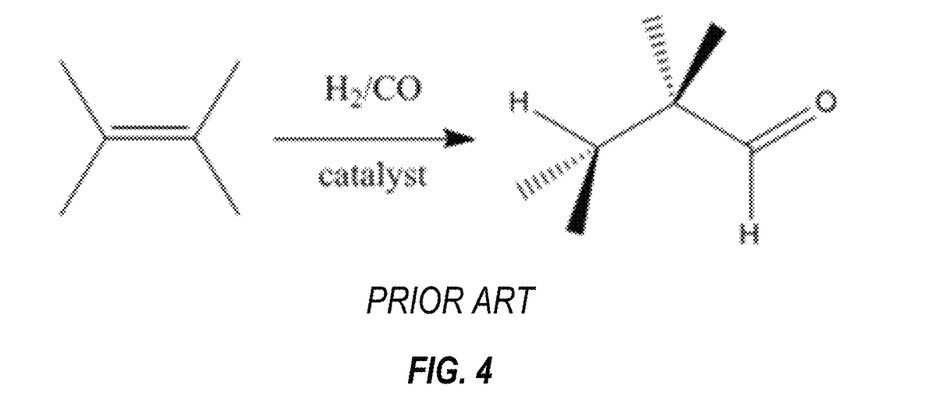
FIG. 4 shows the hydroformylation reaction.

Hydroformylation is the process of reacting an alkene with a mixture of dihydrogen and carbon monoxide (also known as syngas) to produce an aldehyde, as shown in FIG. 4. The gas mixture is held at high temperatures (40-200° C.) and pressures (10-100 atm). The catalyst is often homogeneous, which then requires a separation step to purify the product and recover the catalyst. The catalyst depends on the specific alkene but is typically cobalt or rhodium based, ranging from simple $Co^{2+}$ salts to cobalt carbonyls such as $Co_2(CO)_8$. Industrially, this process is used to generate tens of millions of tons of products annually. Introduction of an appropriate catalyst into PVDF to create a heterogeneous piezocatalyst has the potential to reduce the energy costs considerably by reducing the temperature, pressure, and isolation.

Water Splitting

Under standard acidic conditions the potential to split water into dihydrogen and dioxygen is 1.23 V. (At neutral pH this potential drops to 1.12 V.) In addition, on most surfaces there is an additional potential required to initiate the reaction called the overpotential, which is typically on the order of 0.4 V. Further, the typical catalyst is an expensive metal such as platinum. The PVDF piezocatalyst system is predicted to be able to generate a potential as high as 3 V, so splitting water is a possibility. The key is to find a catalyst that can reduce the overpotential so that the reaction runs at a reasonable rate. A catalyst that drops the overpotential (at a fluorinated tin oxide electrode) to 0.310 V has been demonstrated. $H_2$ is used industrially in a wide variety of processes, with estimates of as much as 70 million tons of $H_2$ per year. Currently most $H_2$ is generated by steam reforming of methane, which has $CO_2$ as a byproduct. Using the PVDF piezocatalyst coupled with sonication would reduce the energy needs and thus costs to generate $H_2$.

Ammonia Synthesis

Ammonia is one of the largest produced chemicals in the modern economy, with annual production exceeding 100 million tons. Much of the ammonia is used in fertilizers, so is critical for maintaining sufficient food for the growing population. Industrially, ammonia is typically produced by the Haber process, which uses an iron catalyst to reduce dinitrogen with dihydrogen:

$$N_2(g) + 3H_2(g) \xrightarrow{Fe} 2NH_3(g)$$

The typical operating conditions for the Haber process are 400-500° C. and 150-250 atm, which is energy intensive. Despite the harsh conditions required for dinitrogen reduction, the reaction is both exothermic ($\Delta_r H° = -92.2$ kJ·mol$^{-1}$) and exogonic ($\Delta_r G° = -33.0$ kJ·mol$^{-1}$) at room temperature. The rate determining step is breaking the $N_2$ triple bond, which is the role of the catalyst. With an optimal catalyst, for example Fe nanoparticles, using the PVDF piezocatalyst with sonication can enormously reduce the energy costs for ammonia production, and perhaps enable production at or close to room temperature and pressure.

EXAMPLES

PVDF, $M_w$, approximately 534,000, was obtained from Sigma-Aldrich and used as received. The co-polymers, [$CH_2CF_2$)$_{0.72}$(CHFCF$_2$)$_{0.28}$]$_n$ and [$CH_2CF_2$)$_{0.65}$(CHFCF$_2$)$_{0.35}$]$_n$ were gifts from the Naval Underwater Warfare Center (Newport, RI). Rhodamine B was obtained from Exciton and was used without further purification. Zn(NO$_3$)$_2$·6H$_2$O, Cr(NO$_3$)$_3$·9H$_2$O and Co(NO$_3$)$_2$·6H$_2$O were obtained from Acros Organics and used without further purification. RhB solutions were made in deionized water with a concentration of $1.0 \times 10^{-5}$ M. Polymer solutions were using a solvent of 9/1 (v/v) acetone/N,N-dimethylformamide and a concentration of 1%, 3%, 5% (w/v) followed by sonication until the solution was clear. For metal-doped polymers, the PVDF solution was mixed with the metal nitrate hydrate. A Branson model 3510R-DTH ultrasonic cleaning bath (100 W) was used to generate the mechanical motion in the polymer films. IR spectra were measured using a Perkin-Elmer Spectrum 100 instrument using 4 scans and 4 cm$^{-1}$ resolution. Absorbance spectra were measured on a Perkin-Elmer 1050 UV-vis-NIR spectrometer with 1 nm resolution in a 1 cm cuvette. Polymer films were formed by spin-coating the polymer solution onto a polycarbonate slide using a Laurel Technologies spin-coater at room temperature (22° C.) under a nitrogen atmosphere with a rotation rate of 1200 rpm. Film thicknesses were measured using a Filmetrics F40 Thin Film Analyzer. To measure the decomposition rates, the polymer coated slide was placed in a glass cuvette (out of the light path of the spectrometer) containing the RhB solution. The spectrum of the RhB was measured prior to sonication and then the cuvette was placed in the ultrasonic bath for a set amount of time, withdrawn from the bath to measure the spectrum. The procedure was repeated for 2 hours of total sonication. The temperature was controlled in the ultrasonic bath by water circulation. Product analysis was done using a Shimadzu LCMS-2020. 10 mL of sonicated sample was collected into a 20 dram vial. 5 mL of toluene was added to the vial followed by vigorous stirring for 1 hr. The organic layer was collected into another 20 dram vial. Two more sequential extractions were performed resulting in 15 mL of toluene extract. The extract was rotary evaporated to dryness and reconstituted in 1 mL of water for injection onto the C18 reverse phase column. Both the mass spectrum and the visible spectrum (diode array) were concurrently collected for each peak.

Figure 5A:
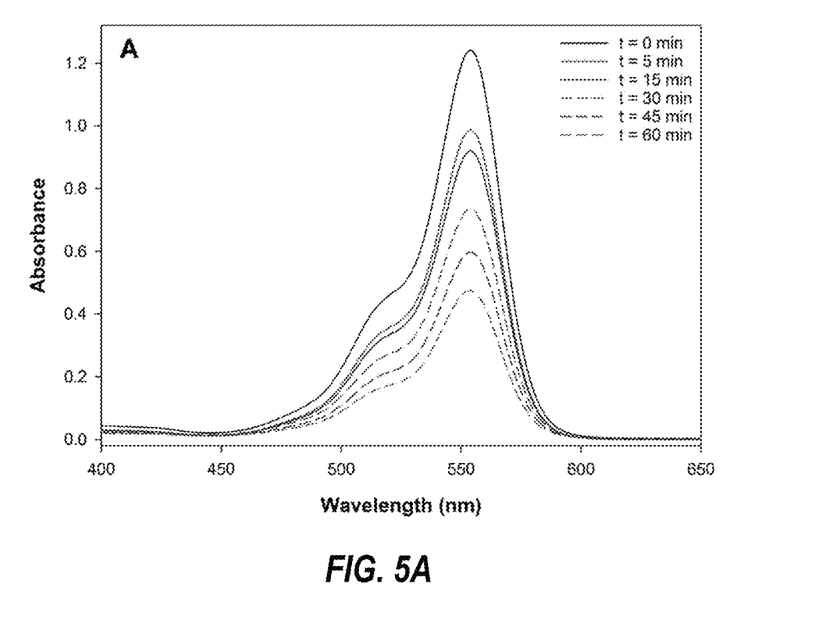
FIG. 5A shows the absorbance spectra of Rhodamine B ($1\times10^{-5}$ M in water) in contact with a film of PVDF doped with 5 mole % $Zn^{2+}$ as a function of time, showing the adsorption of the dye onto the polymer.
Figure 5B:
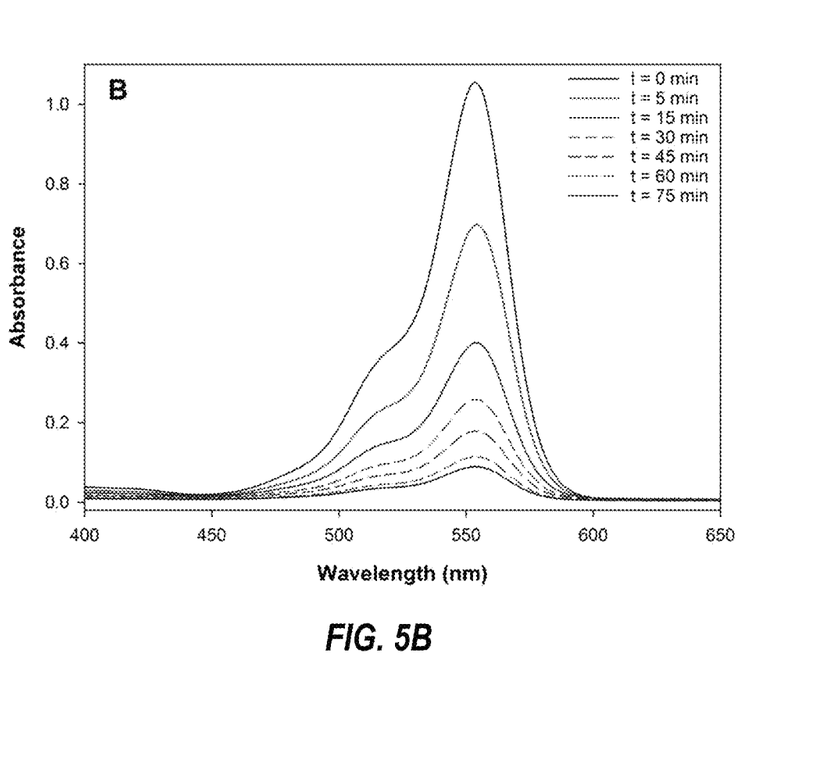
FIG. 5B shows the absorbance spectra of Rhodamine B under the same experimental conditions as FIG. 5A but with sonication in a 70 W ultrasonic bath.
Figure 6A:
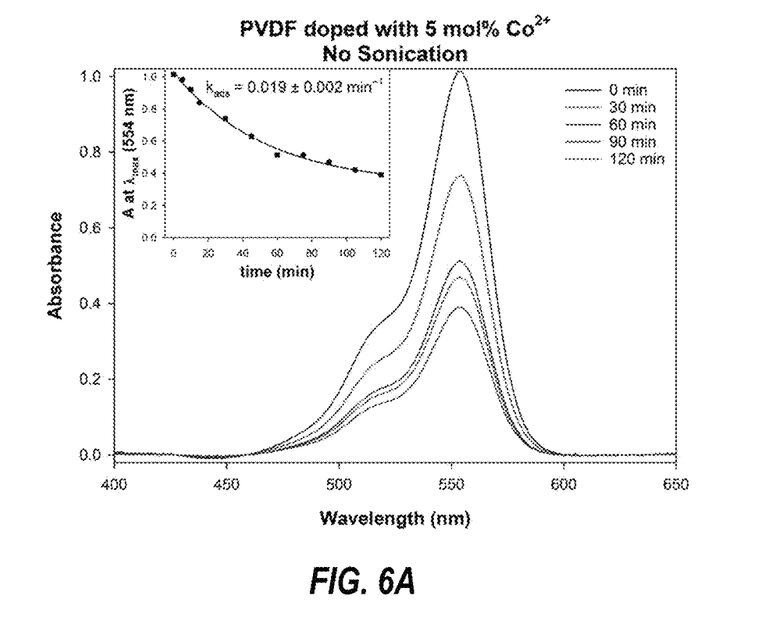
FIG. 6A shows the visible spectra of RhB exposed to films of PVDF doped with 5 mol % $Co^{2+}$ with no sonication. The inset shows the time dependence of the spectral change at $\lambda_{max}$ (554 nm for RhB). The solid lines show the fit to a first order decay with the derived rate constant shown.
Figure 6B:
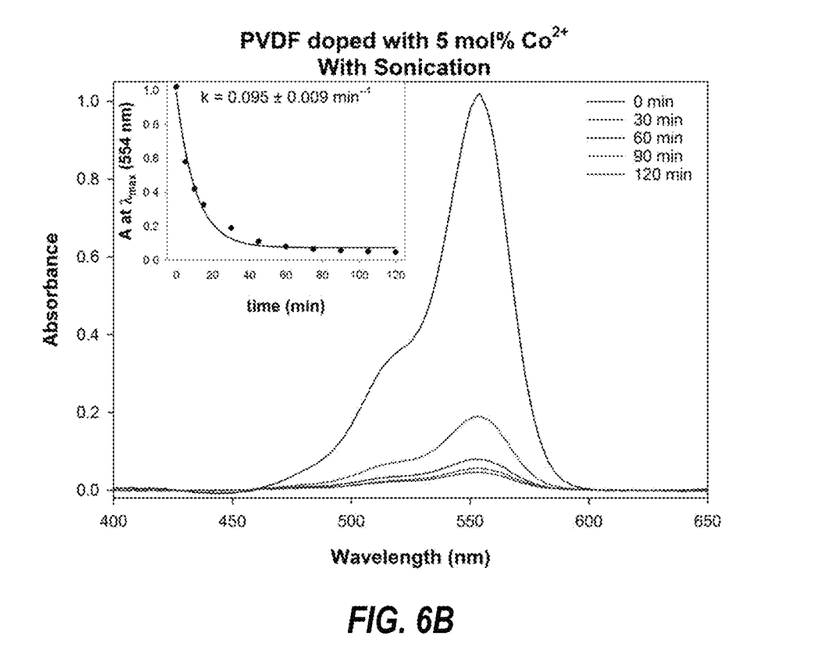
FIG. 6B shows the visible spectra of RhB exposed to films of PVDF doped with 5 mol % $Co^{2+}$ with sonication in a 70 W ultrasonic bath. The inset shows the time dependence of the spectral change at $\lambda_{max}$ (554 nm for RhB). The solid lines show the fit to a first order decay with the derived rate constant shown.

PVDF films were spin-coated onto polycarbonate substrates, including undoped PVDF, PVDF/5 mole % Zn$^{2+}$, PVDF/5 mole % Co$^{2+}$, and PVDF/5 mole % Cr$^{3+}$. These slides were placed in a cuvette containing a 10 μM ($1 \times 10^{-5}$ M) solution of RhB in water and the visible absorption spectrum measured. An alternative application method was used in which a series of disposable cuvettes were prepared by drop-coating the interior walls with PVDF films while leaving the optical path uncoated. As a control, an uncoated cuvette was also used. Each set of films was divided into two groups. One group was allowed to sit and the visible spectrum was monitored periodically. The other set of samples was placed in an ultrasonic cleaning bath (70 W) and exposed to ultrasound. At prescribed intervals the cuvettes were removed from the bath, the visible spectrum recorded, and then returned to the bath for further sonication. The temperature of the water in the ultrasonic bath was controlled using a circulating temperature-controlled water bath. The RhB spectrum decreased for both sets of samples and the PVDF films became noticeably pink, indicating that the RhB was adsorbing onto the PVDF films independent of the sonication. FIGS. 5A and 5B show the spectral changes for PVDF/5 mol % Zn$^{2+}$ in the absence and presence of ultrasonication, respectively. Similarly, FIGS. 6A and 6B show the spectral changes for PVDF/5 mol % Co$^{2+}$ in the absence and presence of ultrasonication, respectively. The spectra demonstrated the loss of RhB from solution but there was no indication of any new spectrum growing in as a function of time. The loss of RhB is markedly greater in the presence of ultrasonication.

Figure 7:
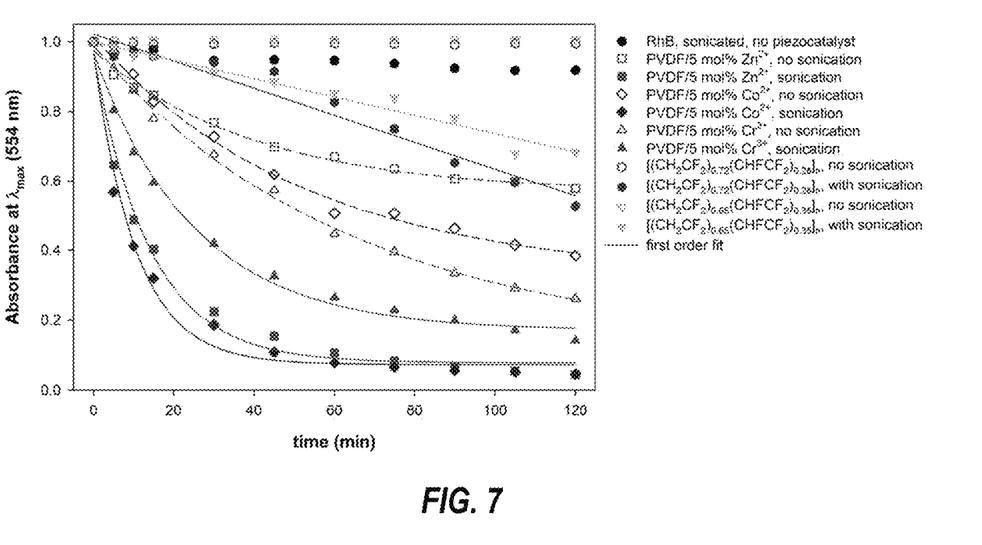
FIG. 7 shows normalized absorption changes as a function of time for different PVDF compositions. Open symbols are in the absence of sonication and filled symbols are with sonication. Solid lines are the first order fits when under sonication and the dashed lines are the first order fits in the absence of sonication.

FIG. 7 shows the kinetic changes for all of the 5 mol % metal-doped PVDF compositions and the two co-polymers for approximately constant thickness films. In the absence of a piezoelectric material (i.e. PVDF), there was no change in the RhB concentration in solution, as expected. This confirms that solution sonochemistry was not responsible for the observed decomposition. When an undoped PVDF film was used, there is a modest decrease in the concentration of RhB for both unsonicated (about −15% after 2 hrs) and sonicated solutions (about −20% after 2 hrs). The small effect of ultrasonication is consistent with the fact that drop-coating PVDF at room temperature leads to films that are primarily α-phase, i.e. nonpolar and non-piezoelectric. When the PVDF was doped with a metal ion, two effects were observed. First, the amount of RhB that is adsorbed onto the polymer film in the absence of sonication is increased. The second change was that the RhB decomposition under sonication was significantly increased compared to undoped PVDF. It is possible that these two outcomes are related. Addition of the metal ion increases the fraction of the polar β-phase in the PVDF film. Since RhB is cationic, it is likely that Coulombic interactions were enhanced near negatively polarized areas of the film to increase the adsorption of the dye. Concurrently, the increased amount of β-phase (and likely γ-phase) increased the piezocatalytic response. The nature of the metal ion dopant appears to have little effect on either the adsorption or decomposition of the RhB: the nondegenerate $d^3$ $Cr^{3+}$, the degenerate $d^7$ $Co^{2+}$, and the closed shell $d^{10}$ $Zn^{2+}$ all had nearly the same response to RhB. Neither charge nor electronic configuration of the metal ion had significant influence on the adsorption or the decomposition of RhB, at least in these experiments. This supports the conclusion that the important component of the interface was the piezoelectric phases of PVDF.

The rate constants for RhB adsorption ($k_{ads}$) and piezocatalyzed decomposition (k) for 750 nm polymer films for all of the compositions are given in Table 3. Errors are the standard error of the fit. The fits for the co-polymers are shown, although the fits are poor and indicate that a first order decomposition in not appropriate. From the data in FIG. 7 the amount of RhB removed from solution is 80-90% for the metal ion doped PVDF samples. The extent of RhB cannot be determined by the available data since the amount of the adsorbed dye that is decomposed is unknown. However, it is expected that the adsorbed dye is most susceptible to the piezoelectric effect since it was directly on the surface. Thus, the propensity for the PVDF/$M^{n+}$ composites to adsorb organic materials is an advantage for the system.

TABLE 3

| Composition | $k_{ads}$ (min$^{-1}$) | k (min$^{-1}$) |
| --- | --- | --- |
| PVDF | no adsorption | 0.015 ± 0.005 |
| PVDF/5 mol % $Zn^{2+}$ | 0.025 ± 0.003 | 0.071 ± 0.007 |
| PVDF/5 mol % $Co^{2+}$ | 0.019 ± 0.002 | 0.095 ± 0.009 |
| PVDF/5 mol % $Cr^{3+}$ | 0.016 ± 0.001 | 0.040 ± 0.003 |
| $[(CH_2CF_2)_{0.72}(CHFCF_2)_{0.28}]_n$ | no adsorption | 0.00001 ± 0.004 |
| $[(CH_2CF_2)_{0.65}(CHFCF_2)_{0.35}]_n$ | no adsorption | 0.00003 ± 0.004 |

Figure 8:
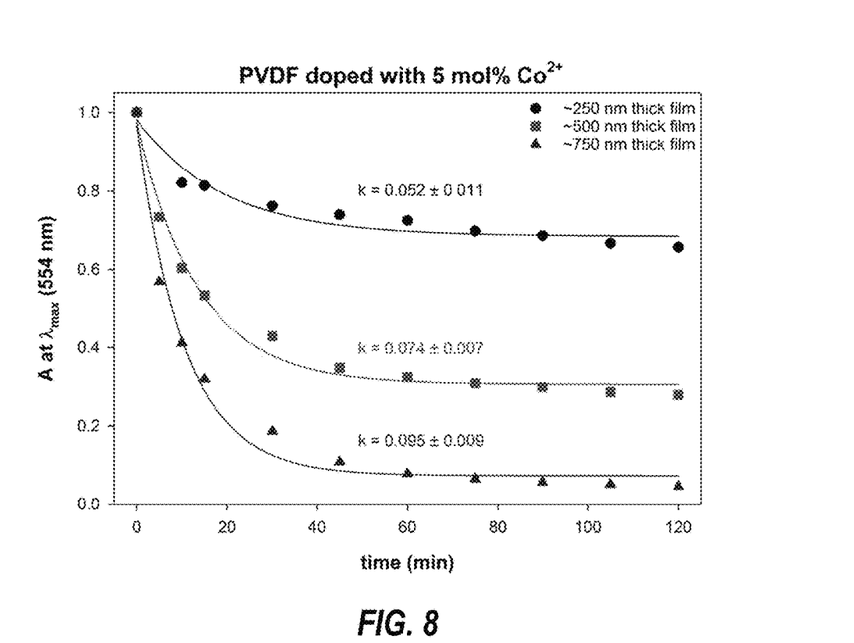
FIG. 8 shows RhB decomposition as a function of film thickness for PVDF/5 mol % $Co^{2+}$ samples.
Figure 9:
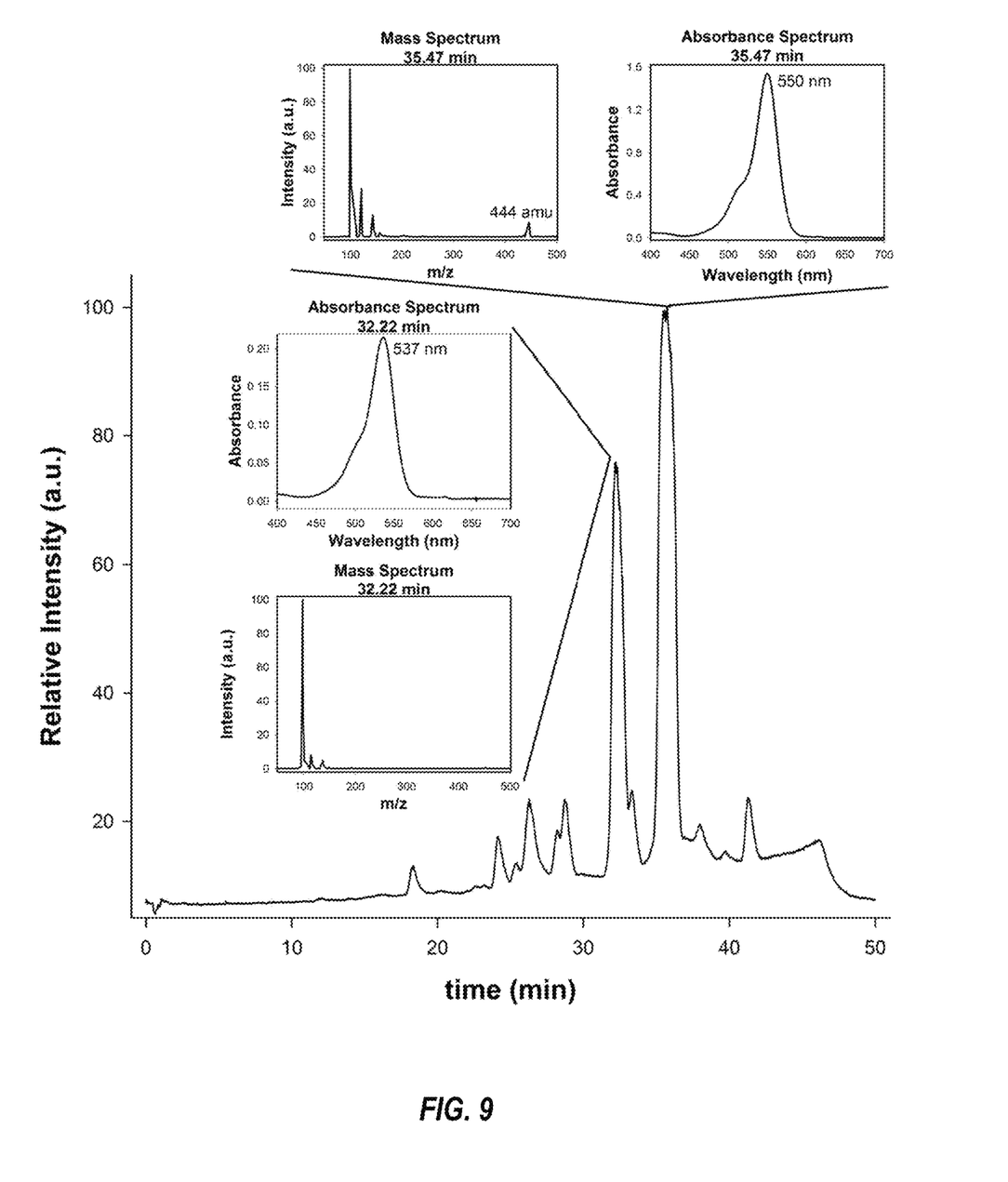
FIG. 9 is the total ion chromatogram of the extracted decomposition products of RhB sonicated in the presence of $Co^{2+}$-doped PVDF. The insets show the mass spectrum and visible spectrum for the two largest chromatographic peaks at 32.22 and 35.47 min.

Equation 1 predicts that the thickness of the polymer film should affect the interfacial potential V, which should change the piezocatalytic response. To test this, films of different thickness were prepared and an example of this is shown in FIG. 8. LC-MS examination of aliquots of the product after sonication showed that the major product of the reaction was removal of one of the ethyl groups from the RhB, as shown in FIG. 9. The largest peak (35.47 min) in the chromatogram is unreacted RhB, as shown by the spectra in the insets. The visible spectrum has a maximum at 550 nm with a shoulder at higher energy, consistent with the known spectra of RhB. The mass spectrum has a peak at m/z=444, indicative of unreacted RhB, $C_{29}H_{31}N_2O_3^+$. The largest decomposition peak is found at 32.22 min and assigned to loss of an ethyl group from RhB. The visible spectrum of the 32.22 min product has the shape of a typical rhodamine spectrum, with a peak at 537 nm, in agreement with the blue shifts seen in the spectra of rhodamines with unsubstituted nitrogen atoms. The fragmentation pattern is similar to that of RhB, consistent with a rhodamine structure. Further, there is a small peak at m/z=449 that can be assigned to a de-ethylated RhB bound to $^{35}$Cl, $[C_{26}H_{26}N_2O_3Cl]^+$. Identification of the other small chromatographic peaks is unknown. Breaking a C—N bond is reasonable since the bond enthalpy for C—N, about 305 kJ·mole$^{-1}$, is the lowest of all the bond types in RhB.

Figure 10:
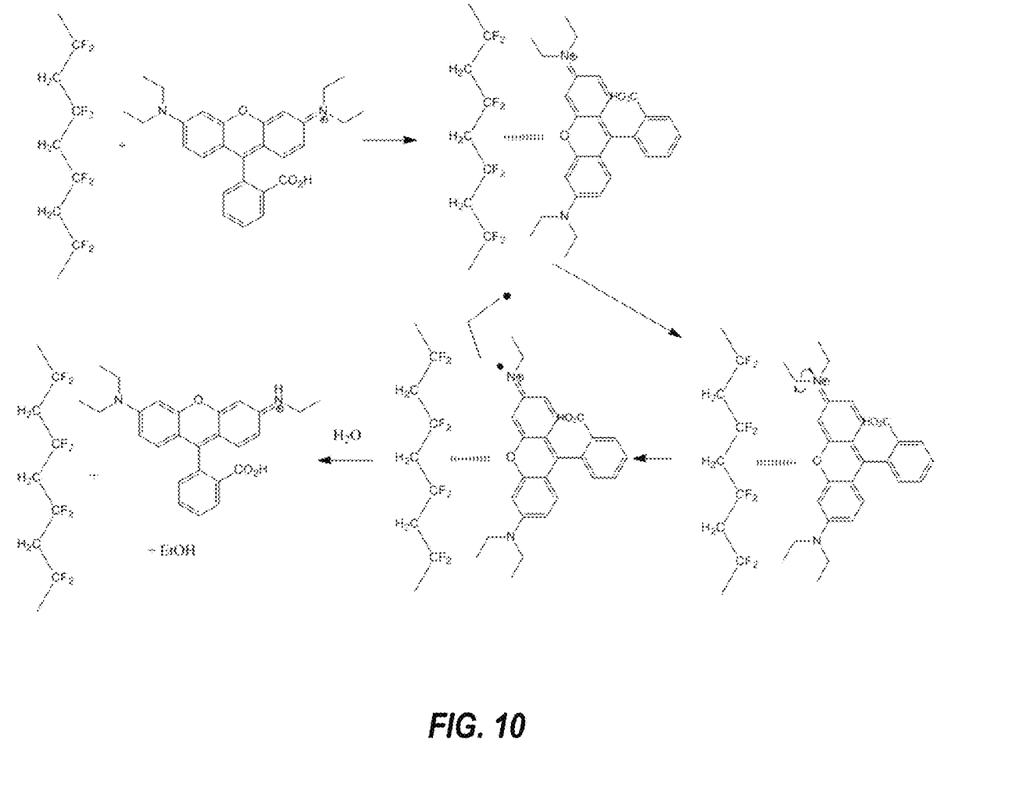
FIG. 10 shows a possible mechanism for the decomposition of RhB using piezocatalysis in accordance with an embodiment of the present invention.

When an oxide such as $BaTiO_3$ is used as the piezocatalyst for the decomposition of RhB, the proposed mechanism is that the piezoelectric field generates electron/hole pairs at the oxide surface. Then the electrons react with dissolved oxygen to form superoxide radical anions and the holes react with aqueous hydroxide to form hydroxyl radicals. The radical species then decompose the RhB in solution. This mechanism seems unlikely for PVDF since generation of radicals at the polymer surface would likely react with the C—H bonds of the polymer before being able to react with the RhB. Thus, we propose that the piezoelectric effect causes direct scission of the C—N bonds of RhB that are adsorbed onto the membrane surface. A possible mechanism is shown below in FIG. 10. The RhB adsorbs to the polymer surface, which is especially effective in the metal-doped polymers. The piezoelectric field drives homolytic scission of the N—C bond and the resultant radicals react with solvent (water) to form the de-ethylated rhodamine and ethanol.

In conclusion, the use of a polymer film as a piezocatalyst was demonstrated for the first time. PVDF, metal ion-doped PVDF, and related co-polymers in a piezoelectric phase all show markedly faster decomposition of RhB under mechanical motion using a common ultrasonic bath. The rates of the decomposition are related to the fraction of piezoelectric phase (either β- or γ-phase for PVDF) and the film thickness, consistent with the voltage generated by the piezoelectric effect at the film surface. The surface electric field induces scission of the weakest bond in RhB, the C—N bond, causing loss of an ethyl group. Reaction with water then leads the primary product observed in the mass spectrum, a rhodamine with one less ethyl group than the RhB.

Note that in the specification and claims, "about" or "approximately" means within twenty percent (20%) of the numerical amount cited. As used herein, the singular forms "a," "an," and "the" include plural referents unless the context clearly dictates otherwise. Thus, for example, reference to "a functional group" refers to one or more functional groups, and reference to "the method" includes reference to equivalent steps and methods that would be understood and appreciated by those skilled in the art, and so forth.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. A piezocatalyst comprising a piezoelectric polymer, wherein the piezoelectric polymer comprises a compound to be decomposed, the compound adsorbed on a surface of the piezoelectric polymer.

2. The piezocatalyst of claim 1 wherein the piezoelectric polymer comprises poly(vinylidene difluoride) (PVDF).

3. The piezocatalyst of claim 1 wherein the piezoelectric polymer comprises a copolymer of PVDF and poly(trifluoroethylene), a co-polymer of 1,1-difluoroethylene and trifluoroethylene, a copolymer of 1,2-difluoroethylene and 1,1,2-trifluoroethylene, or a copolymer of 1,2-difluoroethylene and tetrafluoroethylene.

4. The piezocatalyst of claim 1 wherein the piezoelectric polymer comprises a dopant.

5. The piezocatalyst of claim 4 wherein the dopant is a metal.

6. The piezocatalyst of claim 5 wherein the metal comprises Cu, Zn, Co, Rh, or Cr.

7. The piezocatalyst of claim 5 wherein the metal was derived from a metal nitrate hydrate.

8. The piezocatalyst of claim 5 wherein the piezoelectric polymer comprises 5 mole % of the metal dopant.

9. The piezocatalyst of claim 5 wherein the metal dopant is an ion.

10. The piezocatalyst of claim 9 wherein the ion comprises $Cr^{3+}$, $Co^{2+}$, or $Zn^{2+}$.

11. The piezocatalyst of claim 9 wherein the piezoelectric polymer comprises PVDF and the metal ion dopant increases the amount of β-phase PVDF and/or γ-phase PVDF relative to α-phase PVDF.

12. The piezocatalyst of claim 4 wherein the dopant is a metal oxide.

13. The piezocatalyst of claim 12 wherein dopant comprises ZnO, $Co_2O_3$, or $TiO_2$.

14. The piezocatalyst of claim 4 wherein the dopant comprises a metal salt or a metal carbonyl.

15. The piezocatalyst of claim 1 wherein the piezoelectric polymer comprises a film having a thickness greater than or equal to about 250 nm.

16. The piezocatalyst of claim 15 wherein the piezoelectric polymer comprises a film having a thickness greater than or equal to about 500 nm.

17. The piezocatalyst of claim 16 wherein the piezoelectric polymer comprises a film having a thickness greater than or equal to about 750 nm.

18. The piezocatalyst of claim 1 wherein the compound comprises a C—N bond.

19. The piezocatalyst of claim 1 wherein the compound comprises a dye.

20. The piezocatalyst of claim 19 wherein the dye comprises rhodamine.

21. The piezocatalyst of claim 20 wherein the rhodamine comprises Rhodamine B.

* * * * *